United States Patent [19]

Schörnig et al.

[11] 4,383,751
[45] May 17, 1983

[54] DEVELOPING APPARATUS WITH A ROTATABLE BRUSH HAVING A PROTECTIVE HOOD

[75] Inventors: Eberhard Schörnig, Taunusstein; Klaus Kuemmerl, Nuremberg, both of Fed. Rep. of Germany

[73] Assignee: Hoechst Aktiengesellschaft, Fed. Rep. of Germany

[21] Appl. No.: 315,283

[22] Filed: Oct. 27, 1981

[30] Foreign Application Priority Data

Oct. 28, 1980 [DE] Fed. Rep. of Germany ... 8028682[U]

[51] Int. Cl.³ .............................................. G03D 3/08
[52] U.S. Cl. ...................................... 354/322; 15/77; 118/419
[58] Field of Search ............... 354/316, 320, 321, 322, 354/325; 15/77, 100, 102; 118/419, 427, 428

[56] References Cited

U.S. PATENT DOCUMENTS 4,119,991 10/1978 Martino ............................... 354/320
4,148,576 4/1979 Martino ............................... 354/325
4,240,737 12/1980 Lawson ............................... 354/321

Primary Examiner—Alan Mathews
Attorney, Agent, or Firm—James E. Bryan

[57] ABSTRACT

The invention pertains to a developing apparatus for sheet material, such as flexible printing plates, comprising a double-tank combination with removable inserts which carry transport and guide means for conveying the material on a curved path through the processing liquids; in the apparatus, a rotating brush roller which has an elastically supported counter roller is arranged upstream of the discharge area of the developer tank, the brush roller being covered by a protective hood, the rear bottom edge of which extends below the level of the developer liquid and, in addition to pairs of transport rollers, rotatable deviating rollers are disposed at the coated side of the material and stationary guide means at the reverse side of the material, for transporting the material through the tanks.

4 Claims, 1 Drawing Figure

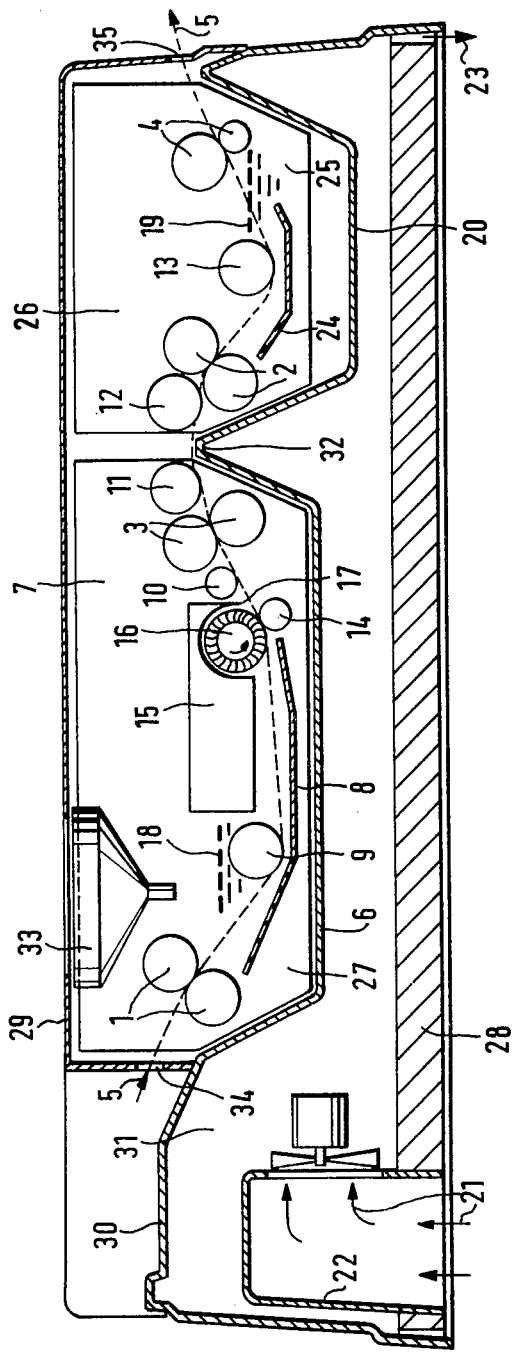

DEVELOPING APPARATUS WITH A ROTATABLE BRUSH HAVING A PROTECTIVE HOOD

The present invention relates to a developing apparatus for sheet material, particularly for flexible printing plates, comprising a double-tank combination equipped with removable inserts for transport and guide means which convey the material on a curved path through the processing liquids.

Developing apparatuses provided with so-called trough-shaped immersion baths in a double-tank combination are known in the art. They generally can be used as continuous table units or as console units for the fully automatic development of photographic papers or, for example, in the field of small offset printing. The previously proposed apparatuses have, however, serious disadvantages. Thus, for example, materials, such as plates, after passing through the apparatus, are undesirably bent and in some cases even shown harmful scratches on the front and/or reverse side. In addition, the material is not always satisfactorily fully developed. Processing baths, moreover, begin to foam after they have been in use for a certain length of time and, as a consequence, treatment must be interrupted. To remedy this disadvantage, it is necessary either to replenish the developer or to add an antifoaming agent or to adjust the apparatus to a slower processing speed. It also happens that processed materials which leave the apparatus are still moist and insufficiently squeegeed and, in these cases, a special drying procedure must follow.

It is, therefore, the object of the present invention to eliminate the above-described disadvantages in a developing apparatus comprising a double-tank combination and to provide an apparatus in which an easy, standardized development and after-treatment, for example, washing or preserving, are possible and which allows the production, for example, of printing plates which meet ultimate requirements.

The invention is based on an apparatus of the aforementioned type, which has the features that a rotating brush roller having an elastically supported counter roller is disposed upstream of the discharge area of the developer tank. The brush roller is covered by a protective hood, the rear bottom edge of which, as viewed in the direction of travel, extends below the level of the developer solution and, in addition to pairs of transport rollers, rotatable deviating rollers are provided at the coated side of the material and stationary guide means at the reverse side of the material, for transporting the material through the tanks. Particularly in the transition area between the developer tank and the after-treating tank, pairs of discharge and feed rollers are installed in the apparatus, which guide the treated material, with the aid of deviating rollers, in such a way that the reverse side thereof is not dragged with its surface over the separating web between the two tanks.

As a result, a simple, uncomplicated developing apparatus can be provided, which is minimally susceptible to trouble, treats the material to be developed gently, operates reliably, and allows a longer use of the baths. Especially on fine screen surfaces, the developing apparatus yields an excellent full development.

By enlarging the area of an original brush spatter guard into a protective hood and lengthening the rear edge of this hood at the discharge end, so that it extends below the bath level, the brush is prevented from picking up air which, otherwise, causes foaming of the bath. Secondly, the bath surface is substantially reduced and hence the developer can be used longer, for example, due to a reduced absorption of oxygen or carbon dioxide from the air, and at the same time a smaller quantity of developer liquid is required, because the protective hood simultaneously acts as a liquid-level displacement float. This has also a favorable effect on the relationship between the contents of the developer and after-treating baths. It has been found that it is advantageous to have, for example, one developer filling for two fillings of the after-treating bath. The material to be processed is guided in such a way that during its passage through the apparatus along a curved path, the coated side of the material is contacted on its surface by rotating rollers only, while the reverse side is contacted only at the edges and guided by the stationary guide means. This ensures a gentle treatment of the material which leaves the developing apparatus of the invention without adverse changes to its surface or any deformation.

The invention is explained in more detail by reference to the accompanying drawing, which shows a diagrammatic longitudinal section through one embodiment of the developing apparatus.

The developing apparatus comprises a cover 29 and a tank bottom 30 which includes the tanks 6 and 20 which are arranged substantially above a motor compartment 31 provided with an air duct 22 and above a base plate 28. The sheet-shaped material to be treated, for example, an imagewise exposed printing plate or a printing plate carrying a fixed toner image and having a metallic or non-metallic support, such as aluminum, paper or plastic film, is introduced into the apparatus through a feed slot 34 in the direction of the arrow 5, with the coated side thereof facing upwardly. The leading edge of the material is seized by a pair of feed rollers and the material is guided by these rollers between a deviating roller 9 and a guide means 8 which may be a plate having a smooth or structured surface, through a bath 27. As the developer medium, solutions may be employed which contain inorganic and/or organic alkaline substances in water and/or organic solvents. In addition to conventional development, it is thus rendered possible, for example, to use the apparatus of the invention for decoating fixed toner-image layers produced by electrophotographic means. When the material has travelled about two thirds of its path, it reaches a brush roller 16 disposed in the discharge area of the developer tank; this brush roller is completely covered with clusters of bristles and preferably rotates in the travelling direction of the material. This arrangement results in a particularly great efficiency of brushing, especially in the case of fine screen surfaces. The thickness of the fibers forming the bristles may, for example, be 0.1 mm and, depending upon the particular purpose, a soft material, for example, polypropylene, or a somewhat harder material may be chosen. The clusters of bristles preferably are helically disposed. The arrangement of clusters not only serves to achieve a satisfactory full development, but also causes a circulation of the bath. The presoaked material is mechanically fully developed between the rotating brush roller 16 and the elastically supported counter roller 14. If materials of different thicknesses are processed the elastically supported counter roller 14 provides for a substantially constant contact pressure between the brush roller 16 and the material. The material is subsequently conveyed to a pair of discharge rollers 3. A roller 10 which is arranged behind the brush roller 16 prevents any bending of the rear edge of the material by the brush roller 16, especially in the case of thin materials. The brush roller 16 itself may run at a higher speed as compared with the transport speed, and this is actually preferred. It also may rotate counter to the transport direction. The brush roller 16 is covered by a protective hood 15 the rear bottom edge 17 of which, as viewed in the direction of travel 5, is immersed into the liquid. The protective hood 15 is constructed as a liquid-level displacement float and is capable of reducing the liquid surface by up to about two thirds. The pair of discharge rollers 3 is provided with a soft rubber coating which has a Shore hardness in the range from about 20° to 50°, preferably from 30° to 40°. By the pair of discharge rollers 3, the material is, to a very large extent, freed from any adhering liquid. Together with the pair of discharge rollers 3 and the pair of feed rollers 2, deviating rollers 11 and 12 serve to transfer the material into the aftertreating bath 25, while preventing the reverse side of the material from being dragged over the separating web 32. In the aftertreating bath 25, the material is subjected to washing or preserving, according to the immersion-bath principle. For this purpose, the leading edge of the material is gripped by the pair of feed rollers 2 and the material is passed through the bath between the guide means 24, for example, a plate which optionally has a structured surface, and a deviating roller 13. At the discharge end, the material is thoroughly squeegeed by means of a pair of discharge rollers 4 which are constructed similarly to the discharge rollers 3. If it is desired that the lower roller of the pair of rollers 4 should not touch the bath level 19, it may have a smaller diameter than the upper roller. The squeegeed material leaves the apparatus through a discharge slot 35 and is pushed onto a delivery table, not shown.

The tanks preferably are filled through a funnel 33 and the correct filling level is controlled with the aid of steplike level control marks. The tank 6 additionally may be provided with heating means (not shown), preferably electrical heating means, regulated by a thermostat, which may, for example, be installed at the bottom and by which the development may be positively influenced. In the case of heating means, the guide means 8 is slotted in order to reach an equal temperature distribution in the developer bath.

The motor compartment 31 is arranged below the tank bottom 30 and at the feed end, upstream of the developing section. An air duct 22 which originates from an opening 21 in the base plate 28 is provided to prevent, if desired, any warming up of the baths by the heat given off by the motor. The admitted air then ventilates the space between the tank bottom 30 and the base plate 28. The discharge opening for the warmed-up cooling air is, for example, situated at the point marked 23 or at any other point of the base plate, preferably in the corner areas.

After the treated materials have left the developing apparatus, they are generally dry within about ½ to 1 minute, under normal room conditions and they are then ready for further processing. They do not exhibit any disturbing buckling, because the material is invariably in a flat position during its passage through the apparatus.

Appropriately, the inserts of the baths 27 and 25 include in their respective side walls 7 and 26 all necessary installations, such as rollers, brush, gear drives, guide means and protective hood. For cleaning, the baths can be emptied with the aid of conventional draining means. The inserts then can be separated from the drive means, laterally at the tank bottom, by disengaging displaceable sleeve couplings and they can be removed individually. This is a great advantage, especially for cleaning purposes. The tanks are, moreover, constructed with rounded edges by which cleaning, for example, using a sponge, is further facilitated. As the inserts are removable, it is particularly easy to clean them, for example, by placing them in a basin and rinsing with water.

The brush roller 16 and all transport rollers of a bath are each preferably driven by way of a shaft. The rotary motion is transmitted by plastic gear wheels. These plastic gear wheels which, in each case, are preferably disposed on one side of the inserts are, advantageously and for reasons of safety, covered by plain plastic parts.

The transport speed ranges, for example, from 0.1 to about 1 m/minute and is infinitely variable in order to obtain different dwell times depending upon the type of material processed, the temperature of the bath contents, and the usability of the bath contents.

It will be obvious to those skilled in the art that many modifications may be made within the scope of the present invention without departing from the spirit thereof, and the invention includes all such modifications.

What is claimed is:

1. In a developing apparatus for sheet material including a double-tank combination equipped with removable inserts for transport and guide means which convey the material on a curved path through the processing liquids, the improvement which comprises rotatable brush roller means and an elastically supported counter roller means disposed upstream of a discharge area of a developer tank, protective hood means covering said brush roller means, the rear bottom edge of said hood means, as viewed in the direction of travel, extending below the level of a developer liquid, pairs of transport roller means, rotatable deviating roller means at the coated side of the material, and stationary guide means at the reverse side of the material, for transporting the material through said tanks.

2. An apparatus according to claim 1 wherein the surface of the rotating brush roller means is completely covered with clusters of bristles, to mechanically assist development.

3. An apparatus according to claim 1 wherein the surface of the brush roller means is fitted with helically arranged bristles.

4. An apparatus according to claim 1 including a separating web between said tanks, said pair of discharge roller means and said pair of feed roller means being arranged in such a manner that, with the aid of deviating roller means, the reverse side of the material is not dragged with its surface over said web.

* * * * *